United States Patent [19]

Koike et al.

[11] 4,043,028
[45] Aug. 23, 1977

[54] METHOD OF FABRICATING COMPOSITE SUPERCONDUCTORS

[75] Inventors: Yoshiyasu Koike, Chigasakishi; Hachio Shiraki, Komukai-Nishimachi; Eigen Suzuki; Makoto Yoshida, both of Yokohamashi, all of Japan

[73] Assignee: Showa Electric Wire and Cable Company, Japan

[21] Appl. No.: 685,903

[22] Filed: May 10, 1976

[51] Int. Cl.² .......................................... H01V 11/00
[52] U.S. Cl. ................................................. 29/599
[58] Field of Search ........................................ 29/599

[56] References Cited

U.S. PATENT DOCUMENTS

| | | | |
|---|---|---|---|
| 3,358,361 | 12/1967 | Kolbe | 29/599 |
| 3,370,347 | 2/1968 | Garwin et al. | 29/599 |
| 3,618,205 | 11/1971 | Barber et al. | 29/599 |
| 3,910,802 | 10/1975 | Wong | 29/599 |

FOREIGN PATENT DOCUMENTS 1,025,715  4/1966  United Kingdom .................. 29/599

Primary Examiner—C.W. Lanham
Assistant Examiner—V. Rising
Attorney, Agent, or Firm—Oblon, Fisher, Spivak, McClelland & Maier

[57] ABSTRACT

A method of making stabilized superconductors of a composition such as $Nb_3Sn$ is disclosed. The method includes forming a stock product comprising a tin base alloy as a core with a copper jacket and having a niobium tube clad thereon. The stock product is then embedded in a good thermally and electrically conducting matrix which is then coreduced until the desired size is obtained. This cold worked product is then submitted to a heat treatment to form superconductors of $Nb_3Sn$.

10 Claims, 4 Drawing Figures

METHOD OF FABRICATING COMPOSITE SUPERCONDUCTORS

BACKGROUND OF THE INVENTION

1. Field of the Invention

This invention relates generally to methods of fabricating stabilized composite superconductors such as $Nb_3Sn$.

2. Description of Prior Art

In order to make stable superconductors for use in solenoids to generate magnetic fields of high intensity, the common practice consists in juxtapositioning the superconductors with a non-superconductive support of very good heat and electrical conductivity and to effect a close thermal contact therebetween. For making composite superconductors of intermetallic composition, crystallizing according to the A 15 structure, particularly such as $Nb_3Sn$, a niobium tubular sheath containing a copper-tin solid solution alloy is embedded in a copper matrix having high conductivity. After this structure is coreduced to the desired size, it is wire-drawn and subjected to a heat treatment, causing a diffusion-reaction for forming $Nb_3Sn$.

Disadvantages of the conventional methods are as follows. In the conventional core containing tin-copper alloys, more than 80 atomic percent tin is used, but the differences in mechanical properties between niobium and the tin-copper alloy are so great (for example, the hardness of niobium is Hv = 180 compared with Hv = 15 for the tin-copper alloy) that non-uniformities in the niobium sheath often cause breakage so that fabrication difficulties occur and the size of the final product is limited. As another example, in a tin-copper alloy containing about 7 to 80 atomic percent tin, the lack of ductility causes the alloy to turn into powder-like grains inside the niobium sheath and also leads to breakage. As a result tin-copper alloys containing more than 7 atomic percent tin are very difficult to fabricate. Hence, copper-tin alloys containing less than 7 atomic percent tin (bronze) are normally used to make $Nb_3Sn$ superconductors by means of a solid-diffusion process.

Composites consisting of a copper-tin alloy containing less than 7 atomic percent tin can be reduced by cold working since these alloys have ductility to a certain extent. However, work-hardening of the alloy is so great that only about 50% reduction in area is possible in cold working. Hence in practice, the process of producing a usable conductor involves numerous repeated working and heat treatment stages.

Another difficulty of using a copper-tin alloy containing more than 25 atomic percent tin is in the reaction involving tin and niobium to form $Nb_3Sn$. The $Nb_3Sn$ formed from the reaction between the copper-tin alloy and niobium has layers of irregularities, including some $Nb_3Sn$ islands dissolved in the copper-tin alloy, and contains discontinuities along the length of the product since the copper-tin alloy takes the liquid state at the reaction temperature required to form $Nb_3Sn$ (700° - 900° C).

SUMMARY OF THE INVENTION

It is accordingly one object of this invention to provide an improved method for fabricating a composite stabilized superconductor of the A 15 type, for example $Nb_3Sn$, which can carry a high critical current density in an economical manner without a need for any intermittent heat treatment.

Briefly, according to the present invention, these and other objects of the invention are achieved by contacting one side of a niobium element with a tin based alloy through a copper layer and the other side with a highly conductive metal, such as copper or aluminum. The resulting composite product is coreduced to the desired size by drawing or rolling, and then submitted to a heat treatment causing tin to diffuse out of the tin based alloy into the copper, forming a copper-tin alloy which then brings about a reaction between niobium and tin to form an intermetallic superconductive composition.

The above and further advantages and objects of this invention will become more apparent from the ensuing detailed specification including several exemplary embodiments when taken in conjunction with the drawings.

DESCRIPTION OF THE PREFERRED EMBODIMENTS

As a first step in the method according to the invention for making, for example, a stabilized mono-filamentary $Nb_3Sn$ superconductor, there is formed a composite structure comprising a tin based alloy core sheathed with copper and a niobium tube jacketed with a ductile material having good thermal and electrical conductivity, in which the tin based alloy and the niobium tube are arranged coaxially with respect to one another. Above mentioned the tin based alloy is made of tin and other elements, such as Zn, Si, Sb, Pb, Al, Cu, Ga and Ge. These elements are added to strengthen the tin, although ductility or elongation of the alloy is preferably maintained above 20%. Hence, the concentration of these elements in the tin is preferably somewhat limited. From these considerations an optimum concentration is chosen of, for example, 15 atomic % Zn and 8 atomic % Cu for Sn-Zn and Sn-Cu alloys, respectively.

Figure 1:
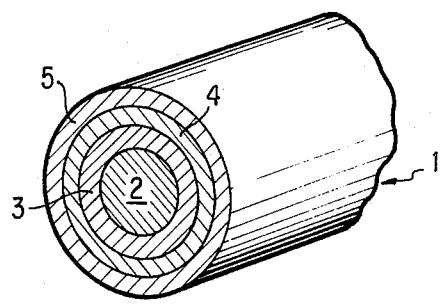
FIG. 1 is a schematic perspective view of one embodiment a composite structure according to the invention.

Referring now to the structure illustrated in FIG. 1, a stock product 1 is shown, made of a tin based alloy core 2 surrounded by a copper jacket 3 and further surrounded by a niobium tube 4 and an outer copper jacket 5 formed of a copper or aluminum matrix which has good electrical and thermal conductivity.

The stock product 1 is subsequently submitted to a wire-drawing step to provide a good mechanical contact between the constituent elements, such as the copper jacket 3 and the niobium tube 4, and between the copper jacket 3 and the tin-copper alloy core 2, and to obtain a compact wire-drawn product having the desired diameter.

Figure 2:
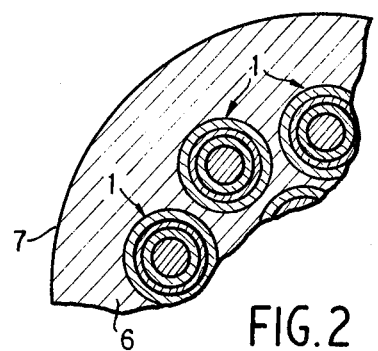
FIG. 2 is a partial cross-sectional schematic view of multi-filamentary composite conductor formed of products as shown in FIG. 1.

According to this invention, stabilized multi-filamentary superconductors may be made from a stock product as shown in FIG. 1. In their manufacture, a plurality of shock products 1 resulting from the above-described manufacturing steps are assembled into a copper matrix 7 to form a multi-filamentary composite 6 which is thereafter submitted to a wire-drawing operation to obtain a compact assembly wherein a close contact exists between each individual outer copper jacket 5 and the copper matrix 7 as shown in FIG. 2.

It is noted that the niobium tube 4 may be used as the materal alloyed with other elements, such as zirconium, for improving the critical current density of $Nb_3Sn$.

Figure 3:
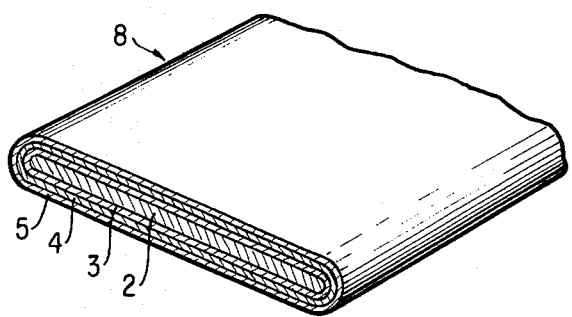
FIG. 3 is a schematic perspective view of one embodiment of a composite tape or ribbon according to the invention; and, FIG. 4 is a partial cross-sectional schematic view similar to FIG. 2 but showing another embodiment of a composite conductor formed in accordance with the present invention.

The stock product 1 may be subjected to an optional rolling operation to transform the product to the form of a compact roller ribbon 8 as shown in FIG. 3.

Figure 4:
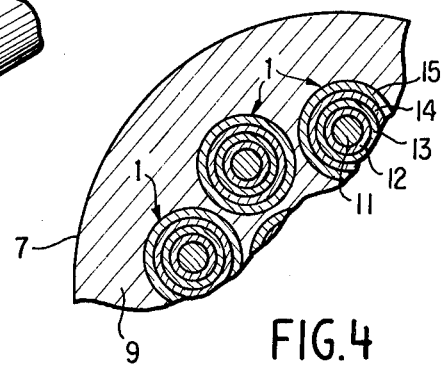

The stock product may also be comprised, as shown in FIG. 4, of a copper core 11 clad with a niobium tube 12 which is in turn surrounded by a copper jacket 13. A tin-copper alloy tube 14 surrounds the copper jacket and is surrounded by a further tube 15 of a material such as aluminum or copper having good electrical and thermal conductivity. The resulting stock product 1' is embedded in a matrix 7 which is preferably substantially the same as that of FIG. 2. Thus a multifilamentary composite structure 9 is formed which is similar to the structure 6 of FIG. 2.

Subsequent to the above-described wire-drawing operation and the optional rolling operation, the product is submitted to a heat treatment which causes tin to diffuse out of the tin base alloy into the copper to form a copper-tin alloy and transforms the niobium into superconducting $Nb_3Sn$ by a reaction with tin at the interface between the niobium and the copper. The heat treatment comprises a heating of the product for a duration of from 2 hours to 100 hours at a temperature in the range from 600° - 750° C.

The copper jacket 3 may be alloyed with other elements, such as nickel, for improving the critical current density of $Nb_3Sn$.

Considering the manufactured superconductor, the copper jacket 3 which separates the niobium tube 4 and tin alloy core 2 serves to reduce the stepwise difference in the mechanical properties between the two and thus makes drawing and rolling processes practical. The presence of the copper jacket 3 is essential to obtain successful milti-filamentary $Nb_3Sn$ superconductors as small as 10μm outer diameter. Moreover, copper plays a catalytic role in the formation of $Nb_3Sn$, allowing a reduction in the reaction temperature from 800° - 900° C (for the niobium-tin reaction) to 600° - 750° C for the present invention, and also reduces the required reaction time.

Use of a tin based alloy beside the copper and niobium with the specific geometrical configuration used according to this invention does not require any intermittent heat treatment between cold working processes. Hence, the manufacturing time and cost are greatly reduced compared to conventional methods.

The average concentration of a copper-tin alloy which forms at the initial stage of the heat treatment can be easily controlled by controlling the tin concentration of the tin base alloy and the wall thickness of the copper jacket. The critical current density of $Nb_3Sn$ is known to increase with the tin concentration in the copper-tin alloy which reacts with niobium. However, it has not previously been possible to produce a composite of niobium with concentrations of more than 7 atomic percent Sn alloy because of the difficulty in mechanical working as mentioned previously. This invention provides a method to overcome this difficulty and also has the advantages of offering $Nb_3Sn$ conductors with high critical current densities.

The critcal current density of $Nb_3Sn$ varies in general with the thickness of the $Nb_3Sn$ layer formed by the diffusion-reaction processes. The thicker the $Nb_3Sn$ layer, the lower the critical current density. According to this invention, however, a thick $Nb_3Sn$ layer can be obtained with a higher critical current density compared to those obtained by conventional methods. For example, a niobium tube with 4 μm wall thickness forms a 2 μm thick $Nb_3Sn$ layer after heat treatment at 700° C for 25 hours and carries a critical current density, $2 \times 10^6 A/cm^2$ at 4 tesla. As a further example, a niobium tube with large inner diameter and wall thickness forms a 9.5 μm thick $Nb_3Sn$ layer after heat treatment at 700° C for 100 hours.

$Nb_3Sn$ formed by conventional methods has only a 3.5 μm thick layer after heat treatment at 700° C for 100 hours and carries a critical current density of only $4 \times 10^5 A/cm^2$. Hence, the advantages of using a tin base alloy are apparent for the formation of $Nb_3Sn$ with copper as a catalyst.

The reaction between niobium and tin may be controlled by the thickness of the copper jacket and tin concentrations of the tin base alloy. During the reaction treatment, tin diffuses into the copper jacket to form a tin-copper alloy. By keeping the tin concentration in the alloy below 25 atomic percent, a uniform layer of $Nb_3Sn$ can be obtained.

According to this invention, tin is confined inside niobium barriers throughout the whole fabrication processes. Since the copper matrix surrounding the niobium tubes is not contaminated by diffusion of tin, electrical and thermal conductivity of the copper matrix is kept high. The $Nb_3Sn$ conductor produced by this method is stabilized against flux jumps and its coil performance to produce high magnetic fields is satisfactory as expected from testing short samples.

The unreacted outer layer of niobium serves to reduce losses when the conductor is operated with alternating current.

Obviously, many modifications and variations of the present invention are possible in the light of the above teachings. It is therefore to be understood that the present invention may be practiced otherwise than as specifically described.

1. A method of fabricating composite superconductors comprising the steps of:
   forming a stock product comprising a tin based alloy core surrounded by a copper jacket which is cladded with a niobium tube;
   embedding at least one of said stock products in a good thermal and electrical matrix in order to make a composite structure;
   coreducing said composite structure until a desired size is obtained; and,
   submitting said coreduced composite structure to a heat treatment.

2. A method as in claim 1 in which said step of submitting includes the step of:
   heat treating said composite structure at a temperature in the range from 600° to 750° C for a period of between 2 and 100 hours.

3. A method as in claim 1 further comprising the step of:
   selecting said core as a tin based alloy with at least one element selected from the group consisting of Zn, Si, Sb, Pb, Al, Cu, Ga and Ge.

4. A method as in claim 1 further comprising the step of: alloying said copper jacket with nickel.

5. A method in claim 1 further comprising the step of: alloying said niobium tube with zirconium.

6. A method as in claim 1 further comprising the step of: rolling said stock product into a ribbon.

7. A method of forming a composite superconductor, comprising the steps of:
   fabricating a stock product comprising a core selected from the group consisting of copper, aluminum and copper aluminum alloy clad with niobium which is surrounded with a copper jacket,
   surrounding said copper jacket with a tin-copper alloy; and,
   embedding at least one of said stock products in a matrix material having good theraml and electrical conductivity.

8. A method as in claim 7, further comprising the step of: selecting copper as the material of said core.

9. A method as in claim 7, further comprising the step of: selecting aluminum as the material of said core.

10. A method as in claim 7, further comprising the step of: selecting copper-aluminum alloy as the material of said core.

* * * * *

UNITED STATES PATENT AND TRADEMARK OFFICE
CERTIFICATE OF CORRECTION

PATENT NO. : 4,043,028

DATED : August 23, 1977

INVENTOR(S) : Koike et al

It is certified that error appears in the above-identified patent and that said Letters Patent are hereby corrected as shown below:

Please insert the following:

--[30] Foreign Application Priority Data

July 31, 1975 Japan ................50-92529--

Signed and Sealed this

Fourth Day of April 1978

[SEAL]

Attest:

RUTH C. MASON
Attesting Officer

LUTRELLE F. PARKER
Acting Commissioner of Patents and Trademarks